| (12) | United States Patent | (10) Patent No.: | US 9,059,563 B2 |
|---|---|---|---|
| | Xu et al. | (45) Date of Patent: | Jun. 16, 2015 |

(54) SELF-SEEDING FIBER LASER, METHOD FOR DRIVING SELF-SEEDING FIBER LASER, PASSIVE OPTICAL NETWORK SYSTEM AND DEVICE

(71) Applicant: HUAWEI TECHNOLOGIES CO., LTD., Shenzhen (CN)

(72) Inventors: Zhiguang Xu, Shenzhen (CN); Dekun Liu, Wuhan (CN); Huafeng Lin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/163,196

(22) Filed: Jan. 24, 2014

(65) Prior Publication Data

US 2014/0161144 A1    Jun. 12, 2014

Related U.S. Application Data

(63) Continuation of application No. PCT/CN2011/077690, filed on Jul. 27, 2011.

(51) Int. Cl.
*H01S 3/30* (2006.01)
*H01S 3/10* (2006.01)
(Continued)

(52) U.S. Cl.
CPC .............. *H01S 3/10084* (2013.01); *H01S 5/14* (2013.01); *H01S 3/067* (2013.01); *H01S 5/141* (2013.01);
(Continued)

(58) Field of Classification Search
CPC ..... H01S 5/0656; H01S 5/4087; H01S 5/146; H01S 5/14; H01S 5/141; H01S 5/0427; H01S 3/10084; H01S 1/067
USPC .......................................... 372/6, 23, 99, 102
See application file for complete search history.

(56) References Cited

U.S. PATENT DOCUMENTS

| 7,679,819 B2 | 3/2010 | Kim et al. ...................... 359/344 |
| 2002/0163941 A1* | 11/2002 | Hsu et al. ........................ 372/18 |

(Continued)

FOREIGN PATENT DOCUMENTS

| CN | 1497894 A | 5/2004 |
| CN | 201608423 U | 10/2010 |

(Continued)

OTHER PUBLICATIONS

Extended and Supplementary European Search Report issued on Sep. 17, 2014 in corresponding European Patent Application No. 11851682.2.

(Continued)

*Primary Examiner* — Kinam Park
(74) *Attorney, Agent, or Firm* — Staas & Halsey LLP

(57) ABSTRACT

This application provides a self-seeding fiber laser, including: an arrayed waveguide grating; a gain medium, coupled to one branch port of the arrayed waveguide grating; a Faraday rotator mirror, coupled to a common port of the arrayed waveguide grating, and configured to reflect a part of optical signals transmitted by the gain medium and form injection light returning to the gain medium; where the gain medium, the arrayed waveguide grating, and the Faraday rotator mirror form a laser resonator, and the arrayed waveguide grating is configured to perform wavelength selection in the laser resonator; and a compensation apparatus, coupled to the gain medium and configured to provide a compensation current for the gain medium selectively according to power of the injection light.

29 Claims, 6 Drawing Sheets

(51) Int. Cl.
- H01S 5/14 (2006.01)
- H01S 3/067 (2006.01)
- H01S 5/042 (2006.01)
- H01S 5/065 (2006.01)
- H04B 10/272 (2013.01)
- H04B 10/50 (2013.01)
- H01S 5/40 (2006.01)
- H04J 14/02 (2006.01)

(52) U.S. Cl.
CPC .............. *H01S 5/146* (2013.01); *H01S 5/4087* (2013.01); *H01S 5/0427* (2013.01); *H01S 5/0656* (2013.01); *H04J 14/0282* (2013.01); *H04B 10/272* (2013.01); *H04B 10/506* (2013.01)

(56) References Cited

U.S. PATENT DOCUMENTS

| | | | |
|---|---|---|---|
| 2004/0067059 A1* | 4/2004 | Song et al. | 398/82 |
| 2006/0083515 A1 | 4/2006 | Hann et al. | 398/87 |
| 2008/0279557 A1 | 11/2008 | Park et al. | |
| 2011/0038635 A1* | 2/2011 | Bai | 398/82 |
| 2011/0129227 A1 | 6/2011 | Wen et al. | |
| 2011/0222857 A1* | 9/2011 | Wen et al. | 398/79 |

FOREIGN PATENT DOCUMENTS

| | | |
|---|---|---|
| CN | 102082610 A | 6/2011 |
| CN | 101426154 B | 7/2011 |
| WO | 02/084822 A2 | 10/2002 |
| WO | WO 2009/123572 A1 | 10/2009 |
| WO | WO 2011/018054 A1 | 2/2011 |
| WO | WO 2011/066775 A1 | 6/2011 |

OTHER PUBLICATIONS

Presi, et al., "Stable Self-seeding of R-SOAs for WDM-PONs", Optical Society of America, 2011, p. 1-3.

Wen, et al., "Light Sources for WDM Passive Optical Networks", COIN-ACOFT, Melbourne, Australia, Jun. 24-27, 2007, p. 1-3.

Brenot, et al., "A Low Cost Solution for Sources and Receivers in WDM-PON", OSA/OFC/NFOEC, 2009, p. 1-3.

Le, et al. "RSOA-based External Cavity Laser as Cost-effective Upstream Transmitter for WDM Passive Optical Network", Optical Society of America, 2011, p. 1-2.

Wong, "Current and Next-Generation Broadband Access Technologies", Optical Society of America/OFC/NFOEC, Australia, 2011, p. 1-24.

Park, et al., "WDM-PON System Based on the Laser Light Injected Reflective Semiconductor Optical Amplifier", ECOC 2005 Proceedings, vol. 3, p. 1-2.

Pfeiffer, "Enhancing PON Capabilities Using the Wavelength Domain", Alcatel-Lucent, Joint ITU/IEEE Workshop on Next Generation Access, Geneva, Jun. 20, 2008, p. 1-22.

International Search Report mailed Sep. 29, 2011 in corresponding International Patent Application No. PCT/CN2011/077690.

International Search Report issued Sep. 29, 2011, in corresponding International Patent Application No. PCT/CN2011/077690.

* cited by examiner

| S1. A gain medium emits data light, and receives an injection light formed when the data light is partially reflected and returns to the gain medium |

↓

| S2: Provide a compensation current for the gain medium selectively according to power of the injection light |

US 9,059,563 B2

SELF-SEEDING FIBER LASER, METHOD FOR DRIVING SELF-SEEDING FIBER LASER, PASSIVE OPTICAL NETWORK SYSTEM AND DEVICE

CROSS-REFERENCE TO RELATED APPLICATIONS

This application is a continuation of International Application No. PCT/CN2011/077690, filed on Jul. 27, 2011, which is hereby incorporated by reference in its entiretiy.

TECHNICAL FIELD

The present application relates to a fiber access technology, and in particular, to a self-seeding fiber laser, a method for driving the self-seeding fiber laser, and a passive optical network (Passive Optical Network, PON) system and a device that employ the self-seeding fiber laser.

BACKGROUND

With ongoing growth of bandwidth requirements of users, fiber access is now a mainstream scheme in an access network, and a passive optical network is especially more competitive. Currently, in many passive optical network solutions, a WDM-PON (wavelength division multiplexing passive optical network) based on a wavelength division multiplexing (Wavelength Division Multiplexing, WDM) technology attracts much attention due to merits such as more enormous bandwidth capacity and information security similar to point-to-point communication.

In a WDM-PON system, transceiver modules of different ONUs (Optical Network Unit, optical network unit) need to communicate with a transceiver module corresponding to an OLT (Optical Line Terminal, optical line terminal) at the central office end by using different communication wavelengths. Therefore, the WDM-PON system requires light sources of different transceiver modules to transmit optical signals of different wavelengths.

To implement colorless light sources, an injection locked FP-LD (Fabry-Perot) laser diode based on external seed light injection or an RSOA (Reflective Semiconductor Optical Amplifier, reflective semiconductor optical amplifier) is proposed as a light source of the WDM-PON system in the industry.

Nevertheless, the injection locked laser solution based on external seed light injection requires one or two high-power flat wide-spectrum light sources as external seed light sources, and the costs are high. In addition, to make the communication wavelength vary between the ONUs, the spectrum of the wide-spectrum light source needs to be segmented, where the spectral segmentation brings a serious problem of power waste.

SUMMARY

This application provides a self-seeding fiber laser and a method for driving a self-seeding fiber laser, which are cost-efficient and reduce power waste, and this application also provides a passive optical network system and a device that employ the self-seeding fiber laser.

A self-seeding fiber laser, including: an arrayed waveguide grating; a gain medium, coupled to one branch port of the arrayed waveguide grating; a Faraday rotator mirror, coupled to a common port of the arrayed waveguide grating, and configured to reflect a part of optical signals transmitted by the gain medium and form injection light returning to the gain medium, where the gain medium, the arrayed waveguide grating, and the Faraday rotator mirror form a laser resonator, and the arrayed waveguide grating is configured to perform wavelength selection in the laser resonator so that a transmitting wavelength of the gain medium is locked into a wavelength path corresponding to the branch port; and a compensation apparatus, coupled to the gain medium and configured to provide a compensation current for the gain medium selectively according to power of the injection light.

A method for driving a self-seeding fiber laser, where the self-seeding fiber laser includes a laser resonator formed by a gain medium, an arrayed waveguide grating, and a Faraday rotator mirror, and the method includes: emitting, by the gain medium, data light, where, after the data light undergoes wavelength selection of a corresponding wavelength path in the arrayed waveguide grating, a part of the data light is reflected by the Faraday rotator mirror to form injection light returning to the gain medium; and providing a compensation current for the gain medium selectively according to power of the injection light.

A passive optical network system, including: an optical line terminal, multiple optical network units, and a remote node between the optical line terminal and the optical network units, where the remote node includes an arrayed waveguide grating and a Faraday rotator mirror, where the arrayed waveguide grating includes a common port and multiple branch ports, the common port is connected to the optical line terminal through a backbone fiber, the Faraday rotator mirror is coupled to the backbone fiber, and the branch ports are connected to the optical network units through branch fibers; and the optical network unit includes a light emitter with a gain medium, where the gain medium, the arrayed waveguide grating, and the Faraday rotator mirror form a self-seeding fiber laser.

An optical line terminal, including: an arrayed waveguide grating, a Faraday rotator mirror, and multiple light emitters with a gain medium, where the multiple optical modules are connected to a backbone fiber through the arrayed waveguide grating, and the Faraday rotator mirror is coupled to the backbone fiber; and the gain medium of the light emitter, the arrayed waveguide grating, and the Faraday rotator mirror form a self-seeding fiber laser.

The self-seeding fiber laser provided in this application filters the output light of the gain medium and reflects a part of the output light to generate reflected light, and injects the reflected light as self-seeding light back to the gain medium for re-amplification. The output light/reflected light is resonated and amplified back and forth for multiple times, so that the wavelength of the output light of the gain medium is locked to the target wavelength, thereby implementing the self-injection locking. The self-seeding fiber laser does not need to use an external wide-spectrum light source, which can reduce costs and avoid power waste caused by power segmentation. By introducing a compensation mechanism into the gain medium, the self-seeding fiber laser provided in this application provides a compensation current for the gain medium selectively according to the power of the injection light, thereby effectively reducing signal quality deterioration that possibly occurs because the injection light is not a straight light, and improving the transmitting performance of the self-seeding fiber laser.

BRIEF DESCRIPTION OF DRAWINGS

To illustrate the technical solutions in embodiments of the present application more clearly, the following briefly introduces the accompanying drawings required for describing the embodiments. Apparently, the accompanying drawings show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

To solve problems of high costs and power waste of an injection locked laser with external seeding light injection, this application provides a self-seeding fiber laser. The self-seeding fiber laser filters an output light of a gain medium and reflects a part of the output light to generate reflected light, and injects the reflected light as self-seeding light back to the gain medium for re-amplification. The output light/reflected light is resonated and amplified back and forth for multiple times, so that the wavelength of the output light of the gain medium is locked to the target wavelength, thereby implementing the self-injection locking. The self-seeding fiber laser does not need to use an external wide-spectrum light source, which can reduce costs and avoid power waste caused by power segmentation. In addition, by introducing a compensation mechanism into the gain medium, the self-seeding fiber laser provided in this application provides a compensation current for the gain medium selectively according to power of the injection light, thereby effectively reducing signal quality deterioration that possibly occurs because the injection light is not a straight light, and improving the transmitting performance of the self-seeding fiber laser.

Figure 1:
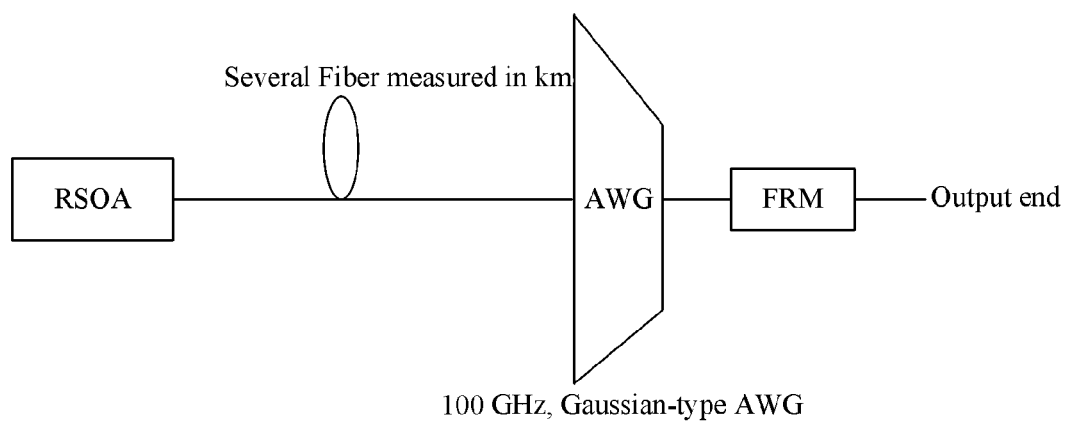
FIG. 1 is a schematic structural diagram of a self-seeding fiber laser according to an embodiment of the present application.

FIG. 1 is a schematic structural diagram of a self-seeding fiber laser according to an embodiment of the present application. The self-seeding fiber laser may be an external-cavity laser that includes a gain medium, an arrayed waveguide grating (Arrayed Waveguide Grating, AWG), a Faraday rotator mirror (Faraday Rotator Mirror, FRM), and a fiber (not shown) connected with the foregoing components. The gain medium may be an RSOA, and the AWG may be used as a filter to select a wavelength for the self-seeding fiber laser. Specifically, the AWG may include a common port and multiple branch ports, the gain medium is connected to one branch port of the AWG, and the FRM is connected to the common port of the arrayed waveguide grating. The FRM may be a 45-degree rotator mirror, and can rotate the polarization direction of a part of optical signals incident through the fiber by 45×2 degrees and reflect the part of optical signals back to the fiber. In a specific embodiment, the FRM may include a Faraday rotator (Faraday Rotator) and a partial mirror, where the Faraday rotator is a 45-degree rotator, and can rotate the polarization direction of the incident light by 45 degrees. Therefore, before and after the incident light is partially reflected by the partial mirror inside the FRM, the incident light needs to penetrate the Faraday rotator twice. Therefore, the polarization direction of the reflected light deviates from the polarization direction of the incident light by 90 degrees, that is, the polarization direction of the reflected light is perpendicular to the polarization direction of the incident light. After multiple back-and-forth trips, the reflected light can keep the same polarization direction as the incident light, so as to be polarization-independent.

The gain medium, the AWG, and the FRM form a laser resonator through the fiber. The AWG serves the purpose of wavelength selection in the laser resonator, the light emitted by the gain medium is resonated back and forth in the resonator to form a lasing light, and the wavelength of the lasing light may be locked into the wavelength path corresponding to the branch port connected with the gain medium.

Figure 2:
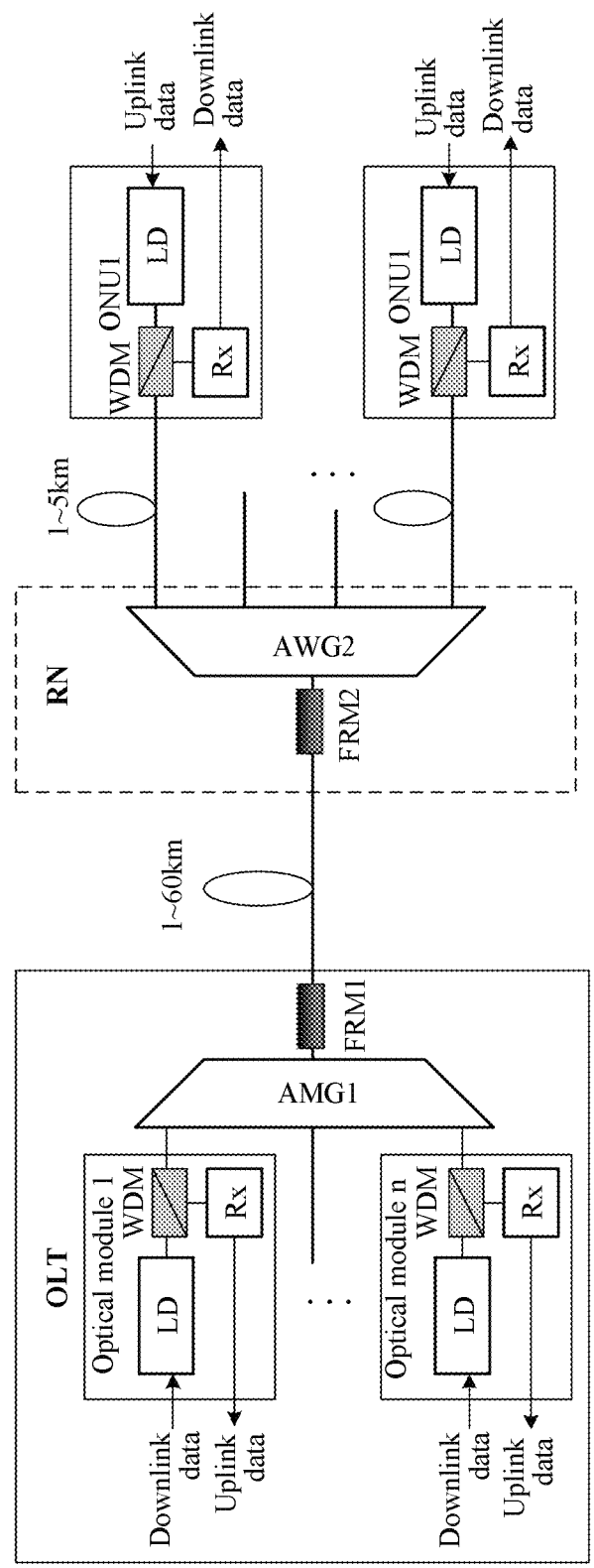
FIG. 2 is a schematic structural diagram of a passive optical network system according to an embodiment of the present application.

FIG. 2 is a schematic structural diagram of a passive optical network system, to which the self-seeding fiber laser shown in FIG. 1 is applicable. The passive optical network system may be a WDM-PON system. It includes an optical line terminal (OLT) located at the central office (Central Office, CO) end, multiple optical network units (ONU) located on the user side, and a remote node (Remote Node, RN) located between the OLT and the ONUs and used to perform wavelength division multiplexing/demultiplexing. The RN includes a wavelength division multiplexing/demultiplexing module such as an AWG. The common port of the AWG is connected with the backbone fiber, and is used to receive a downlink optical signal from the OLT. In addition, the AWG further includes multiple branch ports. Each branch port corresponds to a wavelength passband (that is, each branch port is equivalent to a filter, and each filter has a different passband), and one branch port is connected through a branch fiber to an ONU that works at the corresponding wavelength path. The AWG may be used to perform wavelength demultiplexing for a downlink optical signal from the OLT, and send the signal to the corresponding ONUs through branch ports. The AWG may also be used to perform wavelength division multiplexing for an uplink optical signal from each ONU, and send the signal to the OLT through the common port and the backbone fiber.

The ONU may include a light emitter (LD) and a light receiver (Rx), where the light emitter and the light receiver are coupled to the branch fiber through a wavelength division multiplexer (Wavelength Division Multiplexer). The light emitter may be a light source module capable of modulation, and may have the gain medium. In addition, in this embodiment, the remote node may further include an FRM, where the FRM is coupled to the common port of the AWG. The gain medium inside the light emitter of the ONU, the AWG, and the FRM may form the self-seeding fiber laser. With the self-injection locking function of the self-seeding fiber laser, the transmitting wavelength of the ONU can automatically adapt to the wavelength passband of the corresponding AWG branch port.

In addition, the OLT has a similar structure. For example, the OLT may have multiple optical modules, and one optical module corresponds to one optical network unit. The multiple optical modules are connected to the backbone fiber through the central-office AWG, and an FRM is also coupled to the common port of the central-office AWG. In the OLT, the light emitter of each optical module also has the gain medium. The gain medium in the light emitter of the optical module, the central-office AWG, and the FRM may also form the self-seeding fiber laser mentioned in the preceding embodiment. The self-injection locking of the self-seeding fiber laser can also make the transmitting wavelength of the optical module automatically adapt to the wavelength passband of the corresponding AWG branch port.

In the above WDM-PON system, for the self-seeding fiber laser used by either the user-side ONU or the central-office ONU, in normal communication, the injection light reflected back from the FRM and injected into the gain medium is a part of the uplink or downlink transmitted data that is transmitted at a previous time point, which means that the injection light injected into the gain medium is not a straight light, but is a data light with "1" or "0", that is, the power is variable. In addition, when the power of the injection light is different, the resonance state of the self-seeding fiber laser is also different. For example, when the returning injection light is a "1" emitted at a previous time point and the data currently to be transmitted is also "1", the power of the "1" currently transmitted by the self-seeding fiber laser will be higher; and, when the returning injection light is a "0" emitted at a previous time point and the data currently to be transmitted is "1", the power of the "1" currently transmitted by the self-seeding fiber laser will be lower. As can be seen from the above analysis, the strength of the transmitted signal of the self-seeding fiber laser depends on not only whether the data currently to be transmitted is "1" or "0", but also whether the injection light returning at this time is "1" or "0". The returning injection light is the data signal transmitted at a previous time point, and is generally not correlated with the data signal currently to be transmitted at all. Therefore, the transmit power of the self-seeding fiber laser is not stable.

To further improve the transmitting performance of the self-seeding fiber laser, by introducing a compensation mechanism into a driver current of the gain medium, this application provides a compensation current for the gain medium selectively according to the injection light returning to the gain medium, thereby compensating for impact caused by the "1" and the "0" of the injection light on the transmit power.

In a specific embodiment, if the self-seeding fiber laser can know whether the injection light returning to the gain medium is "1" or "0" at the time of transmitting data, signal processing can be performed in the electrical domain to perform pre-conversion for the data to be transmitted. After the pre-converted electric signal is applied to the gain medium, it interacts with the injection light currently returning to the gain medium to reduce the impact caused by the injection light currently returning to the gain medium on the transmit power of the self-seeding fiber laser and improve quality of the transmitted signal.

Based on the above consideration, this application proposes to rectify the driver current of the gain medium according to the power of the injection light returning to the gain medium and perform pre-conversion for the data to be transmitted, thereby compensating for impacts caused on the transmit power of the self-seeding fiber laser because the injection light is not a straight light. Specifically, if the optical signal currently to be transmitted is "1" and the injection light returning to the gain medium is "0", the driver current of the gain medium increases by a certain rectification value, that is, a certain compensation current is provided; and, if the optical signal currently to be transmitted is "1" and the injection light returning to the gain medium is "1", the driver current of the gain medium remains as the current corresponding to the time when the transmitted optical signal is "1" in an ordinary state, that is, no compensation current is provided. Here, the specific compensation current value depends on the resonance state between the current gain medium and the FRM. In addition, optionally, if the optical signal currently to be transmitted is "0", no matter whether the injection light currently returning to the gain medium is "1" or "0", the driver current of the gain medium may remain as the current corresponding to the time when the transmitted optical signal is "0" in the ordinary state.

In an embodiment, to compensate for the driver current of the gain medium of the self-seeding fiber laser, the self-seeding fiber laser may obtain the light return time $\Delta t$ through measurement first, that is, measure the time that starts when the gain medium transmits an optical signal and ends when the reflected light is injected back to the gain medium, where the reflected light is generated after the optical signal is partly reflected at the FRM. When transmitting the data at a specific time point, the self-seeding fiber laser may adjust the driver current of the gain medium selectively according to the data that is transmitted by the gain medium before a light return time $\Delta t$. As can be obtained from the definition of the light return time $\Delta t$, the injection light returning to the optical gain medium at the current time is the data that is transmitted by the gain medium before a light return time $\Delta t$. In a specific embodiment, after the gain medium transmits the optical signal at the T0 time, the self-seeding fiber laser may delay, according to the measured light return time $\Delta t$, the data to be transmitted, where the delayed data may be used as a basis for compensating for the driver current of the gain medium at the (T0+$\Delta t$) time.

In an embodiment, the self-seeding fiber laser provided in this application may include a light return time measurement apparatus and a compensation apparatus, where the light return time measurement apparatus is configured to measure the light return time of the self-seeding fiber laser; and the compensation apparatus is configured to provide a compensation current for the gain medium selectively according to power of the injection light. For ease of understanding, the following describes structures of the light return time measurement apparatus and the compensation apparatus first with reference to FIG. 3 and FIG. 4, and then describes specific application of the light return time measurement apparatus and the compensation apparatus in the self-seeding fiber laser shown in FIG. 1.

Figure 3:
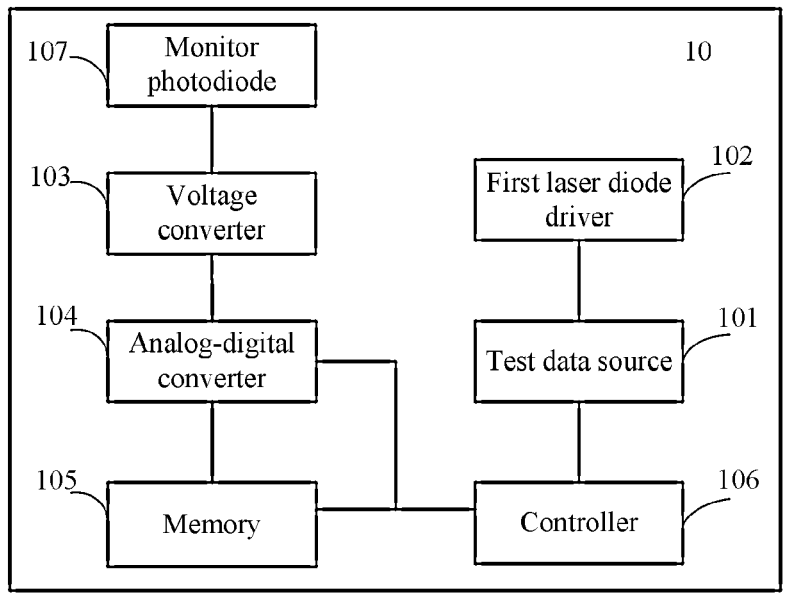
FIG. 3 is a schematic block diagram of a light return time measurement apparatus applicable to a self-seeding fiber laser according to an embodiment of the present application.

FIG. 3 is a schematic block diagram of a light return time measurement apparatus according to the present application.

As shown in FIG. 3, a light return time measurement apparatus 10 provided in the present invention includes:

a test data source 101, configured to generate test data;

a first laser diode driver (Laser Diode Driver, LDD) 102, connected with the test data source 101 and a gain medium (not shown in the figure) of the self-seeding fiber laser, and configured to: generate a bias current and a modulation current to be output to the gain medium when being driven by test data, where the bias current is used to cause the gain medium to be in an amplification state, and the modulation current is used to modulate the test data to an optical signal sent by the gain medium so that the gain medium transmits an optical signal corresponding to the test data;

a monitor photodiode (Monitor Photodiode, MPD) 107, connected to the gain medium and configured to convert the optical power output from a back end surface of the gain medium into a current proportionally;

a voltage converter 103, connected to the monitor photodiode, and configured to convert a current generated by the monitor photodiode into a voltage proportionally;

an analog-digital converter 104, connected with the voltage converter 103 as a sampling module, and configured to perform periodic sampling for output voltage of the voltage converter 103;

a memory 105, connected with the analog-digital converter 104, and configured to store a sampled voltage value of the analog-digital converter 104; and a controller 106, connected with the test data source 101, the analog-digital converter 104, and the memory 105, where the controller is configured to: enable the test data source 101 when the gain medium and an FRM of the self-seeding fiber laser implement resonance, make the test data source 101 output test data to the first laser diode driver 102, and control the output of the test data of the test data source 101 to stop before the optical signal is reflected from the FRM to the gain medium; while enabling the test data source 101, enable the analog-digital converter 104 to perform periodic sampling; and, based on cycle information of the periodic sampling, calculate light return time of the self-seeding fiber laser. For example, the controller may calculate a time difference as the light return time, where the time difference is a difference between the time of the first voltage sampling data after a first blank period after the test data source 101 is enabled and the time of enabling the test data source 101, where the blank period may be a period in which the voltage sampling value includes only a direct current value.

The light return time measurement apparatus in this application can measure the time of arrival of an optical signal at the gain medium, where the optical signal is transmitted from the gain medium and is reflected from the FRM in the case that the gain medium and the FRM implement resonance. Here, a person skilled in the art may understand that the light return time may be applied in the compensation apparatus described below, and may also be used for other purposes, to which this application does not intend to impose any limitation.

In addition, the controller 106 may be further configured to calculate a voltage difference between a high voltage and a low voltage in stored voltages, and calculate, according to the voltage difference, a voltage conversion proportion of the voltage converter, and a current conversion proportion of the monitor photodiode 107, a power difference between a "1" signal and a "0" signal of the injection light reflected from the FRM and returning to the gain medium.

Figure 4:
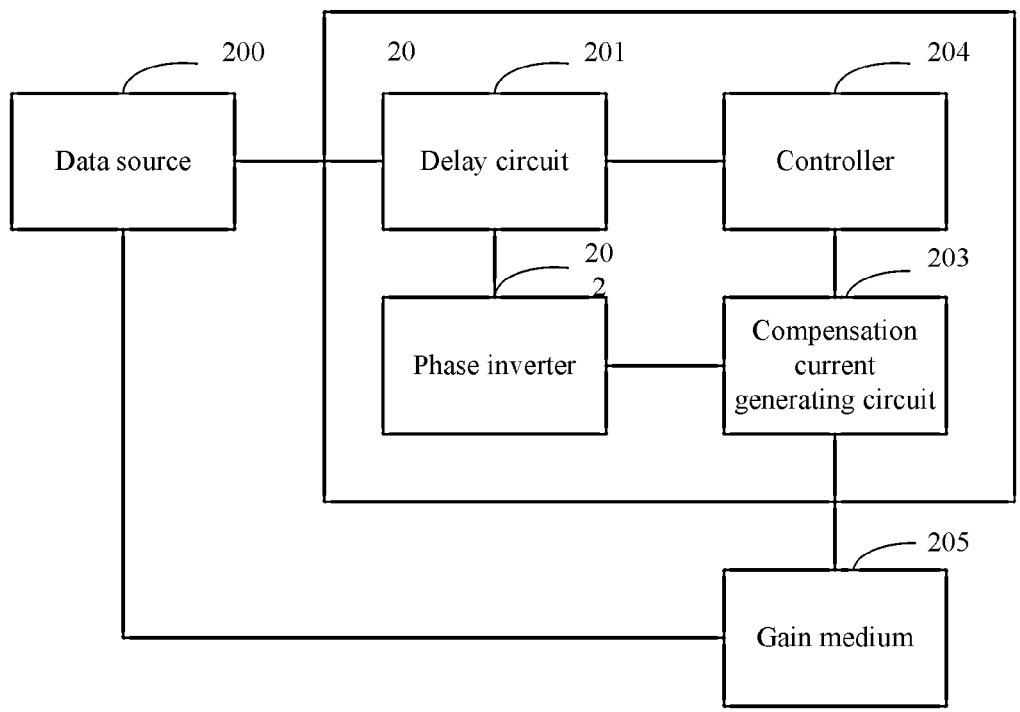
FIG. 4 is a schematic block diagram of a compensation apparatus applicable to a self-seeding fiber laser according to an embodiment of the present application.

FIG. 4 is a schematic block diagram of a compensation apparatus according to the present application. As shown in FIG. 4, the compensation apparatus 20 in this application includes:

a delay circuit 201, connected with a data source 200, and configured to delay data transmitted from the data source 200;

a phase inverter 202, connected with the delay circuit 201, and configured to perform phase inversion for the data received from the delay circuit 201; and a compensation current generating unit 203, connected with the phase inverter 202, and configured to generate a compensation current selectively according to output data of the delay circuit 201 and provide the compensation current for the gain medium 205, where, for example, in an embodiment, the compensation current generating circuit 203 may generate a compensation current when the output data of the delay circuit 201 is "1" after undergoing phase inversion of the phase inverter 202; or, in another embodiment, the compensation current generating circuit 203 may generate a compensation current when the output data of the delay circuit 201 is "0", where no phase inverter 202 needs to be set for the delay circuit 201 and the compensation current generating unit 203; and a controller 204, connected with the delay circuit 201 and the compensation current generating circuit 203, and configured to control a delay time of the delay circuit 201 so that a sum of delays of the transmitted data of the delay circuit 201, the phase inverter 202, and the compensation current generating unit 203 is equal to a sum of a light round-trip time of the self-seeding fiber laser and the time of arrival of data at the gain medium 205, where the data is transmitted by the data source 200; and control the value of the compensation current generated by the compensation current generating circuit 203, for example, the controller 204 may calculate the value of the compensation current according to a power difference between the "1" signal and the "0" signal of the injection light returning to the gain medium and according to a scale factor between the current of the gain medium and the transmitted optical power, and control the compensation current generating circuit 203 to generate a compensation current of a corresponding value.

The power compensation apparatus in this application can compensate for the power difference of the transmitted signal that is caused by the "1" and the "0" in signals of the injection light reflected from the FRM, thereby enhancing the transmitting performance of the self-seeding fiber laser massively.

Figure 5:
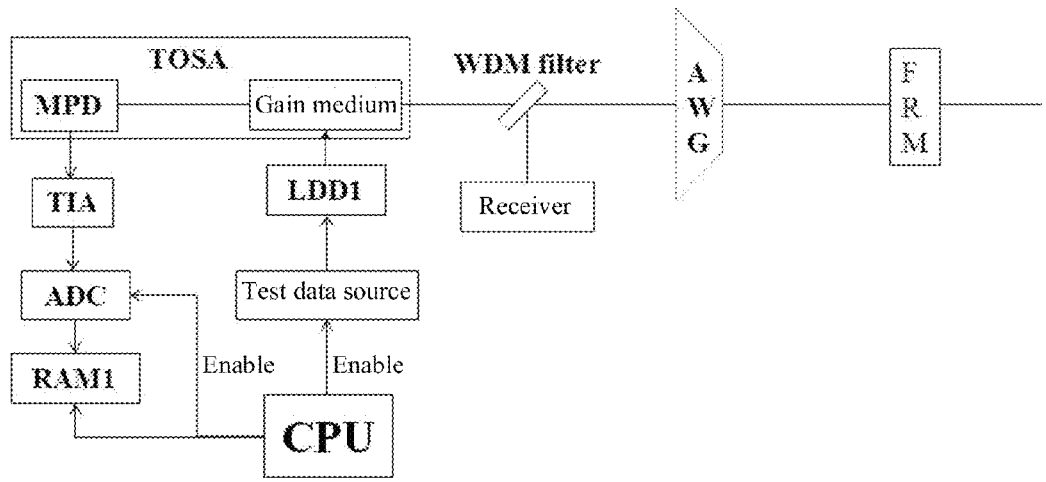
FIG. 5 is a schematic diagram of a self-seeding fiber laser with a light return time measurement apparatus according to an embodiment of the present application.

The following describes the specific application of a light return time measurement apparatus according to this application in a self-seeding fiber laser with reference to FIG. 5.

FIG. 5 is a schematic structural diagram of a self-seeding fiber laser with a light return time measurement apparatus according to the present application. In the self-seeding fiber laser in FIG. 5, a test data source, a laser diode driver (LDD1), a transimpedance amplifier (Transimpedance Amplifier, TIA), an analog-digital converter (ADC), a random access memory (RAM1), a central processing unit (CPU), and a monitor photodiode (MPD) respectively correspond to the test data source 101, the first laser diode driver 102, the voltage converter 103, the analog-digital converter 104, the memory 105, the controller 106, and the monitor photodiode 107 shown in FIG. 3.

In the self-seeding fiber laser shown in FIG. 5, an MPD is configured to measure a distance between the gain medium and the FRM, where the MPD is packaged in the same transmitter optical subassembly (Transmitter Optical Subassembly, TOSA) as the gain medium and is set close to a high reflective surface of the gain medium, where the high reflective surface is a surface (generally a back end surface) opposite to a light-emergent surface (generally a front end surface) of the gain medium. When the gain medium is emitting light, a majority of the light energy is output from its front end surface. However, because its back end surface is a high reflective surface rather than a 100% full reflective surface, a minority of the light is output from the back end surface and received by the MPD. The MPD converts the received optical power into a current proportionally and outputs it. Therefore, the value of the optical power currently received by the MPD can be inferred by detecting the size of the output current of the MPD. In addition, the part of backward optical power received by the MPD is generally in a fixed proportion to the forward transmit power of the gain medium. Generally, the forward transmit power of the gain medium can be deduced by using the power received by the MPD. In this embodiment, the MPD is configured to monitor the transmit power of the gain medium and is further configured to measure the accurate time spent by the reflected light of the gain medium from being emitted to being reflected by the FRM back to the gain medium, that is, the light return time of the self-seeding fiber laser.

On a condition that the gain medium and the FRM have implemented resonance, the CPU enables the test data source to make the gain medium transmit a signal of specific content, that is, a test signal. In this embodiment, the CPU needs to control the transmitting of the test signal to stop before the light reflected from the FRM is injected into the gain medium. After the gain medium finishes transmitting, the LDD1 still needs to provide a bias current for the gain medium. However, because the transmitting of the test signal has stopped at this time, no modulation current is provided for the gain medium. The bias current is intended to ensure that the gain medium still works in an amplification state, so that the reflected signal that comes in from the front end surface of the gain medium will not be absorbed by the gain medium, but can be output from the back end surface of the gain medium after passing through the gain medium, and then received by the MPD.

When enabling the test data source to transmit the test signal, the CPU enables the ADC to perform periodic sampling for the output signal of the MPD, and stores the sampling result into the RAM1. A person skilled in the art should understand that, although the memory shown in FIG. 5 is a RAM, the memory may also be another storage medium.

In the embodiment of the present invention, the ADC sampling is periodic. Therefore, all data stored in the RAM1 includes time information, where time information of the first sampled data is the time of the CPU starting to enable the ADC, that is, the time T0 when the gain medium starts to transmit the test data. Time information of the second stored data is the time $T0+(1/k)$, and time information of the $n^{th}$ stored data is the time $T0+(n/k)$, where k is a sampling rate of the ADC. The time of the reflected signal arriving at the MPD can be obtained by analyzing the data stored in the RAM1, and then the light return time of the self-seeding fiber laser can be calculated. Refer to the following description for details.

With reference to FIG. 5, the following describes in detail a working process in which a self-seeding fiber laser in the present application measures the light return time. The MPD converts the received optical power into a current proportionally at all times, and outputs it to a TIA; and the TIA converts the current into voltage in real time. If the MPD receives no optical power currently, the output current is zero, and the voltage output by the TIA is also zero. At the time T0, the gain medium starts to send test data, and at the same time, the ADC starts to sample the voltage output by the TIA, and records the sampled values into the RAM1. When the gain medium transmits test data, a part of light energy of the test data necessarily penetrates the back end surface of the gain medium and is received by the MPD. The MPD and the TIA also convert this part of light energy into the corresponding current and voltage signals, which are then sampled by the ADC. As mentioned above, the test data transmitting process of the gain medium stops before the light reflected from the FRM returns to the gain medium, thereby preventing the test data and the reflected signal from coinciding in the gain medium.

In a specific embodiment, optionally, the CPU may control the test data source to make the gain medium transmit the test data only in a very short time, thereby ensuring that the test data transmitting process of the gain medium stops before the reflected signal arrives at the gain medium. Because the test data transmitting process stops before the reflected signal arrives at the gain medium, the MPD responds to the reflected signal only when a blank period has expired after the MPD responds to the test data. In the blank period, the gain medium has only a direct current bias but has no modulation data, the response of the MPD is only a direct current quantity. In another aspect, both the test data and the reflected signal include "1" and "0", and the MPD responds to the "1" and the "0" in different ways, and therefore, the response made by the MPD before and after the direct current quantity changes in real time.

As described above, because the sampling performed by ADC is periodic, the sampled values of the ADC, which are recorded in the RAM1, include time information. According to the position of the first data after the blank period (that is, the time period in which the MPD response is a direct current quantity), where the position indicates what number the first data after the blank period is among the sampled values since start of the sampling, the CPU can deduce the accurate time spent after the light emitted from the gain medium is reflected until the corresponding reflected signal returns to the gain medium, thereby obtaining the light return time of the self-seeding fiber laser.

In addition, according to the sampling result of the ADC, not only the accurate time spent after the light emitted from the gain medium is reflected until the light returns to the gain medium can be calculated, but also the power difference caused by the "1" signal and the "0" signal in the reflected signal can be calculated, where the power difference may be used as an important parameter for driver current compensation of the gain medium. Because the current output by the MPD is in direct proportion to the received optical power, and the voltage output by the TIA is in direct proportion to the received current of the MPD, the sampled value of the ADC is in direct proportion to the power received by the MPD. When the injection light returning to the gain medium is "1", the optical power arriving at the MPD is high; and, when the injection light returning to the gain medium is "0", the optical power arriving at the MPD is low. In the self-seeding fiber laser in this application, the CPU can deduce, according to the sampled value stored in the RAM and the conversion relationship between the MPD and the TIA, the power difference between the "1" and the "0" of the injection light returning to the gain medium.

In this application, according to the light round-trip time of the self-seeding fiber laser and according to the power difference between the "1" and the "0" of the reflected injection light, the compensation apparatus shown in FIG. 4 can compensate for the driver current of the gain medium in the self-seeding fiber laser, thereby reducing the impact caused by the power difference between the "1" and the "0" of the injection light returning to the gain medium on the transmitting performance of the self-seeding fiber laser.

The following describes in detail the specific application of a compensation apparatus according to this application in a self-seeding fiber laser with reference to FIG. 6 to FIG. 9.

Figure 6:
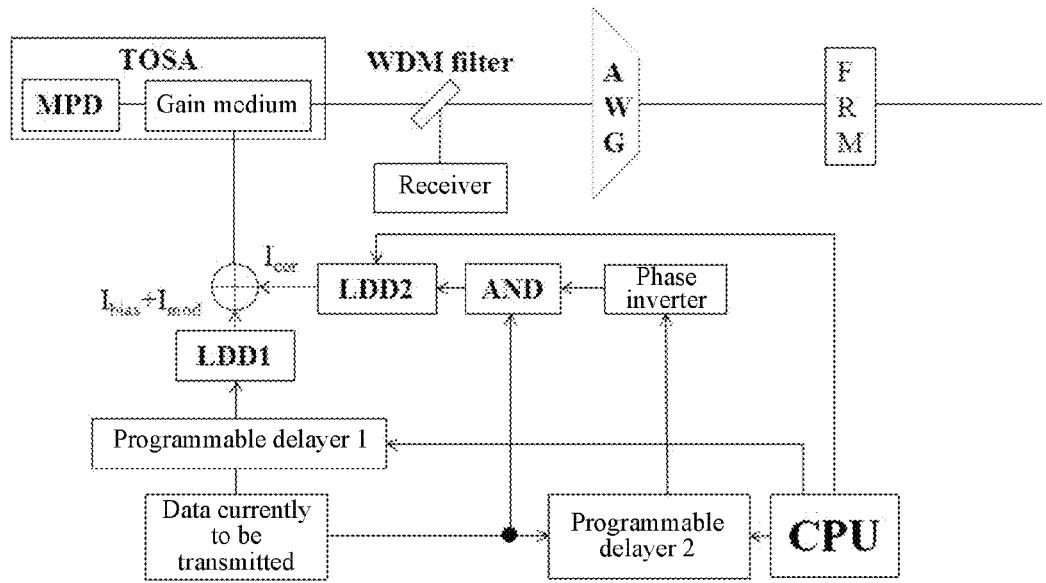
FIG. 6 is a schematic diagram of a self-seeding fiber laser with a compensation apparatus according to a first embodiment of the present application.

FIG. 6 is a schematic structural diagram of a self-seeding fiber laser with a compensation apparatus according to a first embodiment of the present application. In the self-seeding fiber laser shown in FIG. 6, a data source module currently ready to transmit data, a second programmable delayer (that is, programmable delayer 2), a phase inverter, and a CPU respectively correspond to the data source 200, the delay circuit 201, the phase inverter 202, and the controller 204 shown in FIG. 4; and, an AND gate (AND) and a second laser diode driver (LDD2) correspond to the compensation current generating circuit 203 shown in FIG. 4

In addition, the self-seeding fiber laser shown in FIG. 6 further includes a first programmable delayer (that is, programmable delayer 1) and a first laser diode driver (LDD1). The LDD1 is configured to provide an ordinary bias current $I_{bias}$ and a modulation current $I_{mod}$ for the gain medium according to the data currently to be transmitted; and, the first programmable delayer is configured to delay, for a preset time, the data currently to be transmitted and then provide the data for the LDD1, where the preset time is used to compensate for a delay of a logical "AND" operation process of the AND gate, so that the bias current $I_{bias}$ and the modulation current $I_{mod}$ that correspond to the data currently to be transmitted can be output to the gain medium almost in parallel with the compensation current $I_{cor}$ corresponding to the injection light returning to the gain medium.

In the self-seeding fiber laser shown in FIG. 6, the data currently to be transmitted is divided into three parts: the first part enters the LDD1 through the first programmable delayer, and the ordinary bias current $I_{bias}$ and the modulation current $I_{mod}$ are generated; the second part enters an input end of the AND gate; and the third part passes through the second programmable delayer and the phase inverter, and then enters the second input end of the AND gate. The signal output from the AND gate enters the LDD2 to drive the LDD2 to generate the compensation current $I_{cor}$. In the embodiment shown in FIG. 6, only digital signals "1" or "0" are output from the AND gate to the LDD2, respectively indicating whether the LDD2 provides a compensation current or not. The specific value of the compensation current may be obtained through calculation by the CPU according to the power difference between the "1" and the "0" of the injection light and according to the conversion relationship between the current and the transmitted optical power, and is set for the LDD2. In this way, the normal currents $I_{bias}+I_{mod}$ provided by the LDD1 and the compensation current $I_{cor}$ provided by the LDD2 are overlaid together and provided for the gain medium to drive the gain medium to transmit the optical signal.

The following explains the functions of the AND gate, the second programmable delayer, and the phase inverter. A circuit formed by the foregoing modules may be primarily configured to: when the data currently to be transmitted is "1", if the injection light returning to the gain medium is "1", provide no compensation for the driver current of the gain medium; and if the injection light is "0", provide a compensation current $I_{cor}$ for the gain medium to boost the modulation current of the gain current; and, further, the circuit is configured to: when the data currently to be transmitted is "0", provide no compensation for the driver current of the gain medium no matter whether the injection light returning to the gain medium is "1" or "0".

When the data is initially transmitted, the first part of data passes through the first programmable delayer and drives the LDD1 to generate an ordinary bias current and ordinary modulation current $I_{bias}+I_{mod}$; the second part of data enters the first input end of the AND gate; and the third part of data has not arrived at the second input end of the AND gate due to delay. Therefore, the second input end of the AND gate is 0. At this time, the output of the AND gate is also 0, that is, no compensation current $I_{cor}$ is generated. In fact, the injection light returning to the gain medium at this time is the straight light that resonates previously, and also needs no compensation.

About a light return time later, the initially transmitted data is about to return to the gain medium. At this time, the second data that has undergone the delay by the second programmable delayer and the phase inversion by the phase inverter arrives at the second input end of the AND gate, and the CPU is used to control the delay time length of the second programmable delayer properly. In this way, the data that enters the second input end of the AND gate at this time is exactly opposite to the injection light that is about to return to the gain medium. That is, the current return injection light is "1", and the data that enters the second input end of the AND gate is "0"; or, the current return injection light is "0", and the data that enters the second input end of the AND gate is "1".

After the injection light that is about to return to the gain medium is "negated", an "AND" operation is performed for the injection light and the data currently to be transmitted. Therefore, when the injection light is "1", no compensation current is generated no matter whether the data currently to be transmitted is "0" or "1"; and, when the injection light is "0", the result of the "AND" operation is the data currently to be transmitted. That is, when the data currently to be transmitted is "1", the LDD2 is instructed to generate a compensation current $I_{cor}$; and, when the data currently to be transmitted is "0", the LDD2 is instructed to generate no compensation current $I_{cor}$.

Table 1 summarizes whether it is necessary to provide the compensation current $I_{cor}$ for the gain medium under different conditions based on the above analysis. As can be seen from the table, the compensation apparatus provided in this embodiment can fulfill the same compensation purpose as the foregoing self-seeding fiber laser, and therefore, the transmitting performance of the self-seeding fiber laser can be enhanced.

TABLE 1

Compensation current under different conditions

|  | Injection light data returning to the gain medium | |
| --- | --- | --- |
| Currently transmitted data | 1 | 0 |
| 0 | No compensation | No compensation |
| 1 | No compensation | Compensation |

In the embodiment shown in FIG. 6, the first programmable delayer is intended to compensate for a delay possibly generated by the AND gate. In this way, one input of the "AND" gate is a result of "negating" the data transmitted by the data source before the light round-trip time, that is, a result of "negating" the injection light currently returning to the gain medium, and the other input of the "AND" gate is the data currently to be transmitted. Therefore, it can be ensured that the compensation current under different conditions shown in Table 1 is implemented, and, because the operation in the AND gate takes some time, the first programmable delayer can make the compensation operation more precise.

Specifically, it is assumed that the data source starts to send data initially at the time T0, the delay of the first programmable delayer is T1, and the light return time is Δt, then, the data initially sent by the data source arrives at the gain medium at the time T0+T1, and returns to the gain medium at the time T0+T1+Δt. At this time, the injection light returning to the gain medium is the data sent from the data source at the time T0. In addition, the current transmitted data corresponding to the injection light returning to the gain medium at the time T0+T1+Δt is the data that is transmitted from the data source at the time T0+T, and the generated compensation current $I_{cor}$ corresponds to the data that is input to two input ends of the AND gate at the time T0+T, that is, the data transmitted from the data source at the time T0+Δt and an inverted phase of the data transmitted from the data source at the time T0.

Figure 7:
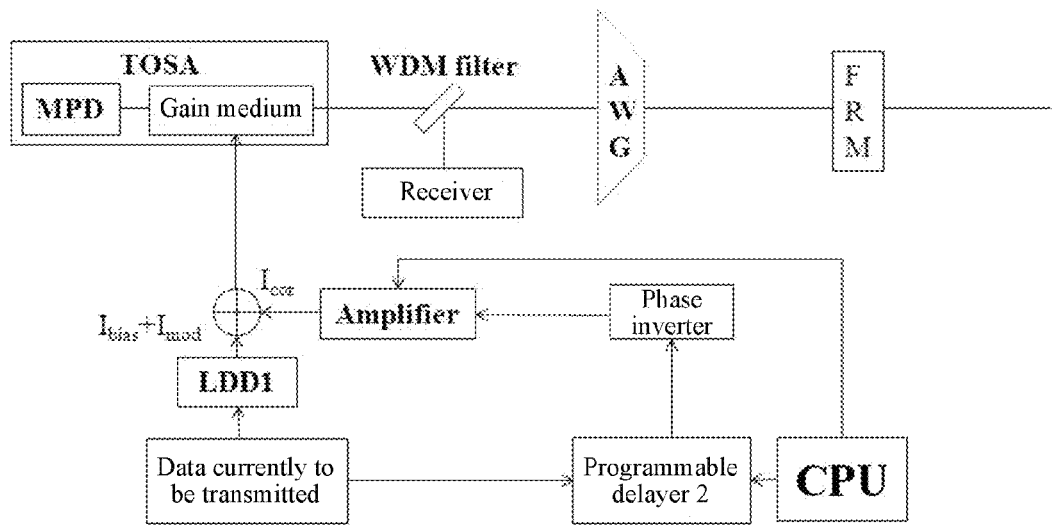
FIG. 7 is a schematic diagram of a self-seeding fiber laser with a compensation apparatus according to a second embodiment of the present application.

FIG. 7 is a schematic structural diagram of a self-seeding fiber laser with a compensation apparatus according to a second embodiment of the present invention. The self-seeding fiber laser shown in FIG. 7 differs from the self-seeding fiber laser shown in FIG. 6 primarily in that an amplifier (Amplifier) is used as a compensation current generating circuit in place of the AND gate and the LDD2 shown in FIG. 6.

In the self-seeding fiber laser shown in FIG. 7, the data currently to be transmitted is divided into two parts: the first part enters the LDD1, and an ordinary bias current $I_{bias}$ and a modulation current $I_{mod}$ are generated; and the second part passes through a programmable delayer and a phase inverter and then enters an amplifier, and a compensation current $I_{cor}$ is generated. The CPU can control the delay time length of the programmable delayer properly so that the total time spent by data in passing through the programmable delayer, the phase inverter, and the amplifier is equal to the light round-trip time. In addition, only a digital signal "1" or "0" is provided by the phase inverter for the amplifier, indicating whether to generate a compensation current. The specific current value of the compensation current may be calculated by the CPU according to the power difference between the "1" and the "0" of the injection light and according to the conversion relationship between the current and the transmitted optical power, and is set for the amplifier. In this way, the normal currents $I_{bias}$+$I_{mod}$ provided by the LDD1 and the compensation current $I_{cor}$ provided by the amplifier are overlaid together and provided for the gain medium to drive the gain medium to transmit the optical signal.

The following specifically explains the functions of the delayer, the phase inverter, and the amplifier. When the data is initially transmitted, the first part of data drives the LDD1 to generate an ordinary bias current and ordinary modulation current $I_{bias}$+$I_{mod}$; the second part of data has not arrived at the input end of the amplifier due to the delay effect of the programmable delayer. Therefore, at this time, the input end of the amplifier is 0, and the output of the amplifier is also 0, that is, no compensation current $I_{cor}$ is generated. In fact, the injection light returning to the gain medium at this time is the straight light that resonates previously, and also needs no compensation. About a light return time later, the initially transmitted data is about to return to the gain medium. At this time, the second part of data has undergone the delay by the delayer and the phase inversion by the phase inverter, and enters the input end of the amplifier, and is amplified by the amplifier. Due to the phase inversion effect of the phase inverter, the current data output from the output end of the amplifier at this time is exactly opposite to the injection light data returning to the gain medium, that is, the current return injection light is "1", and the data sent by the data source is "1", and therefore, the data that passes through the phase inverter and arrives at the input end of the amplifier is "0", and the amplifier inputs no compensation current; and, the current return injection light is "0", the data sent by the data source is "0", the data at the input end of the amplifier is "1", and the amplifier outputs a compensation current $I_{cor}$, where the specific value of the compensation current $I_{cor}$ depends on the amplifier amplification factor set by the CPU.

That is to say, when the injection light is "1", the amplifier outputs "0", and no compensation current is generated, that is, no compensation current is generated no matter what data is currently transmitted. When the injection light is "0", the amplifier outputs a current of a specific value, that is, a compensation current is generated no matter what data is currently transmitted, and therefore, the gain medium obtains a greater modulation current, and can achieve the same transmit power as the injected "1" to enhance the transmitting performance. Table 2 summarizes whether a compensation current exists under different conditions according to the above analysis.

TABLE 2

Compensation current under different conditions

| Currently transmitted data | Injection light data returning to the gain medium | |
| --- | --- | --- |
| | 1 | 0 |
| 0 | No compensation | Compensation |
| 1 | No compensation | Compensation |

The second embodiment differs from the first embodiment in that: as long as the injection light data returning to the gain medium is "0", the compensation current $I_{cor}$ is generated to compensate for the driver current of the gain medium. When the transmitted data is "0", the transmit power is much lower than the transmit power existing when the transmitted data is "1", and therefore, the power difference of the transmitted data "0", which is caused by "1" and "0" of the injection light returning to the gain medium, is much smaller than the average power, and the transmitting performance of the self-seeding fiber laser can still be improved.

In addition, as mentioned in the first embodiment above, in the case that the data transmitted from the data source drives the LDD1 to generate a delay of an ordinary bias current and modulation current $I_{bias}$+$I_{mod}$, the time spent by the data in passing through the amplifier, the phase inverter, and the programmable delayer should be equal to the light round-trip time plus the delay in the LDD1, thereby ensuring that the ordinary bias current and modulation current $I_{bias}$+$I_{mod}$ and the compensation current $I_{cor}$ are generated based on the source data of the same time point. In this way, it is assumed that at the time T0, the data transmitted from the data source is delayed by the LDD1 and arrives at the gain medium at the time T1, and returns to the gain medium at the time T2 after a light round-trip time Δt expires. At this time, after the data transmitted from the data source at the time T0 is delayed by the LDD1 and the light round-trip time Δt expires, the compensation current needs to be generated at the time T2. As mentioned above, the data transmitted from the data source at the time T0 is the same as the data that arrives at the gain medium at the time T1, and is also the same as the data that returns to the gain medium at the time T2, and the compensation current generated by the amplifier at the time T2 is an inverted phase of the data transmitted from the data source at the time T0, and therefore, when the injection light is "0", the driver current of the gain medium can be compensated for, thereby improving the transmitting performance of the self-seeding fiber laser.

Figure 8:
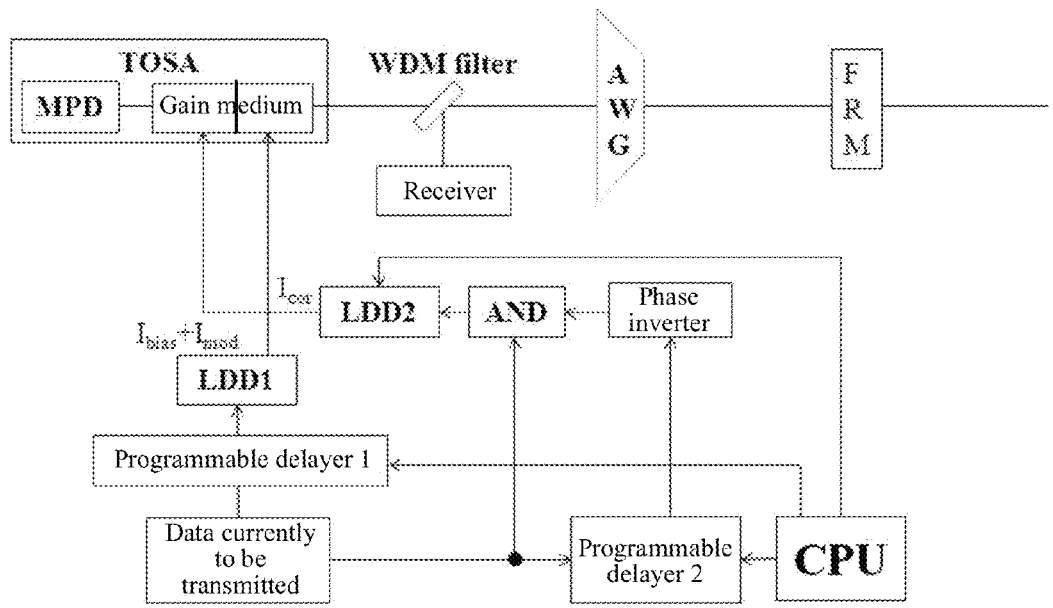
FIG. 8 is a schematic diagram of a self-seeding fiber laser with a compensation apparatus according to a third embodiment of the present application.

FIG. 8 is a schematic structural diagram of a self-seeding fiber laser with a compensation apparatus according to a third embodiment of the present application. The self-seeding fiber laser shown in FIG. 8 differs from the self-seeding fiber laser shown in FIG. 6 primarily in that a gain medium with two gain regions is applied. The ordinary bias current and modulation current $I_{bias}+I_{mod}$ is applied to a first half part (that is, the gain region close to the transmitting side of the gain medium) plated with a highly permeable film, and the compensation current $I_{cor}$ is applied to a second half part (that is, the gain region far away from the transmitting side of the gain medium) plated with a highly permeable film in the gain medium. With the self-seeding fiber laser shown in FIG. 8, the data signal and the compensation signal can be controlled separately, so that the control is simpler, thereby further improving the transmitting performance of the self-seeding fiber laser.

In the self-seeding fiber laser shown in FIG. 8, the data currently to be transmitted is divided into three parts: the first part enters the LDD1 through the first programmable delayer, and an ordinary bias current $I_{bias}$ and a modulation current $I_{mod}$ are generated; the second part enters an input end of the AND gate; and the third part passes through the second programmable delayer and the phase inverter, and then enters the second input end of the AND gate. The signal output from the AND gate enters the LDD2 to drive the LDD2 to generate a compensation current $I_{cor}$. In this way, the normal currents $I_{bias}+I_{mod}$ provided by the LDD1 is applied to the first half part of the gain medium, and the compensation current $I_{cor}$ provided by the LDD2 is applied to the second half part of the gain medium.

The functions of the AND gate, the second programmable delayer, and the phase inverter are the same as those in the first example, and the only difference as against the first example is the current loading mode. The following describes the working mode of a two-segment gain medium with examples.

When the injection light returning to the gain medium is "0", if the data to be transmitted at this time is "1", the injection light is amplified by the ordinary bias current and modulation current $I_{bias}+I_{mod}$ at the first half segment of the gain medium; after the light enters the second half segment of the gain medium, because a compensation current $I_{cor}$ is applied at this time, the injection light is amplified again; and, after the injection light is reflected by the back end surface of the gain medium and enters the first half segment of the gain medium again, the injection light is amplified by the ordinary bias current and modulation current $I_{bias}+I_{mod}$ again because the transmitting of the data "1" has generally not been completed by this time. Therefore, the injection light undergoes an amplification-amplification-amplification process.

When the injection light returning to the gain medium is "0", if the data to be transmitted at this time is "0", the injection light is attenuated by the ordinary bias current and modulation current $I_{bias}+I_{mod}$ at the first half segment of the gain medium; after the light enters the second half segment of the gain medium, because no compensation current $I_{cor}$ is applied at this time, the injection light is attenuated again; and, after the injection light is reflected by the back end surface of the gain medium and enters the first half segment of the gain medium again, the injection light is attenuated again because the transmitting of the data "0" has generally not been completed by this time. Therefore, the injection light undergoes an attenuation-attenuation-attenuation process.

When the injection light returning to the gain medium is "1", if the data to be transmitted at this time is "1", the injection light is amplified by the ordinary bias current and modulation current $I_{bias}+I_{mod}$ at the first half segment of the gain medium; after the light enters the second half segment of the gain medium, because no compensation current $I_{cor}$ is applied at this time, the injection light is attenuated; and, after the injection light is reflected by the back end surface of the gain medium and enters the first half segment of the gain medium again, the injection light is amplified by the ordinary bias current and modulation current $I_{bias}+I_{mod}$ again. Therefore, the injection light undergoes an amplification-attenuation-amplification process.

When the injection light returning to the gain medium is "1", if the data to be transmitted at this time is "0", the injection light is attenuated by the ordinary bias current and modulation current $I_{bias}+I_{mod}$ at the first half segment of the gain medium; after the light enters the second half segment of the gain medium, because no compensation current $I_{cor}$ is applied at this time, the injection light is attenuated again; and, after the injection light is reflected by the back end surface of the gain medium and enters the first half segment of the gain medium again, the injection light is attenuated again. Therefore, the injection light undergoes an attenuation-attenuation-attenuation process.

According to the above analysis, Table 3 summarizes whether a compensation current exists under different conditions and shows a round trip of amplification and attenuation of the injection light in the gain medium. As can be seen from Table 3, when the data currently to be transmitted is "0", the injection light is attenuated at all times no matter whether the injection light is "1" or "0"; when the data currently to be transmitted is "1", the injection light "0" is amplified three times, and the injection light "1" is amplified twice and attenuated once. Therefore, in the case that the injection light is "0", the gain medium undergoes more amplifications so that the transmit power is basically similar to the transmit power existing when the injection light is "1", thereby improving the transmitting performance of the self-seeding fiber laser.

TABLE 3

Amplification and attenuation of compensation current and injection light under different conditions

| Currently transmitted data | Injection light data returning to the gain medium | |
|---|---|---|
| | 1 | 0 |
| 0 | No compensation (attenuation-attenuation-attenuation) | No compensation (attenuation-attenuation-attenuation) |
| 1 | No compensation (amplification-attenuation-amplification) | Compensation (amplification-amplification-amplification) |

In the description in the foregoing embodiment, for ease of description, only the amplification and attenuation scenarios of the injection light in the gain medium are enumerated. Understandably, in fact, the amplification and the attenuation of the injection light here are relative concepts, and do not necessarily represent actual amplification and attenuation of the injection light. For example, the amplification factor of the injection light in an injection light attenuation scenario is smaller than the amplification factor of the injection light in an injection light amplification scenario; or, in the injection light attenuation scenario, the injection light actually remains unchanged, but in the injection light amplification scenario, the injection light is amplified; or, in the injection light amplification scenario, the injection light remains unchanged, but in the injection light attenuation scenario, the injection light is attenuated, and so on. A person skilled in the art may understand that the above examples are merely illustrative, and the embodiments of the present invention do not intend to impose any limitation thereto.

In addition, in the foregoing embodiment, the driver current compensation scenario differs from the non-compensation scenario in that the current is amplified and attenuated by the compensation current in the second half segment of the gain medium. Here, because the compensation current is directly applied to the second half segment of the gain medium, the power difference caused by the injection light amplification and attenuation performed by the compensation current is actually the power difference caused by the overlaid compensation current. Therefore, the specific value of the compensation current output by the LDD2 can be set in the foregoing way to precisely compensate for the power difference caused by the injection light "1" and the injection light "0".

In addition, the function of the first programmable delayer also lies in compensating for a delay possibly generated by the AND gate, and its function is the same as that described in the embodiment shown in FIG. 6, and is not repeated here any further. In addition, a person skilled in the art may understand that the description about the structure and the working process of the compensation apparatus of the self-seeding fiber laser in FIG. 6 may be applicable to the self-seeding fiber laser in this embodiment, to which the embodiment of the present invention does not intend to impose any limitation.

Figures 9, 10:
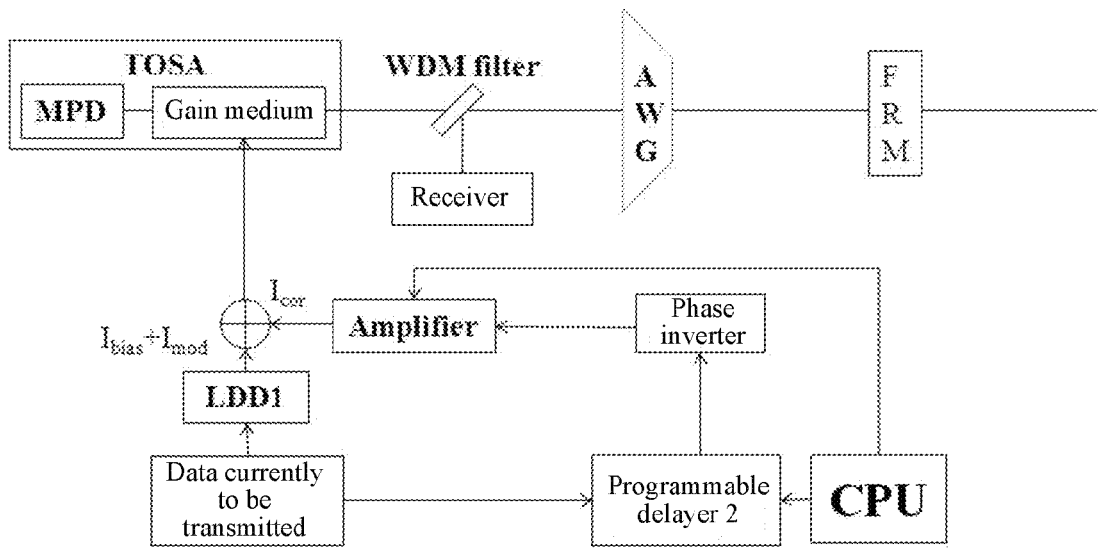
FIG. 9 is a schematic diagram of a self-seeding fiber laser with a compensation apparatus according to a fourth embodiment of the present application.
FIG. 10 is a schematic flowchart of a method for driving a self-seeding fiber laser according to an embodiment of the present application.

FIG. 9 is a schematic structural diagram of a self-seeding fiber laser with a compensation apparatus according to a fourth embodiment of the present invention. The self-seeding fiber laser shown in FIG. 8 differs from the self-seeding fiber laser shown in FIG. 7 primarily in that a gain medium with two gain regions is applied. The compensation current $I_{cor}$ is applied to the second half part plated with a highly permeable film in the gain medium, and the ordinary bias current and modulation current $I_{bias}+I_{mod}$ is applied to the first half part plated with a highly permeable film in the gain medium. With the self-seeding fiber laser shown in FIG. 9, the data signal and the compensation signal can also be controlled separately, so that the control is simpler, thereby further improving the transmitting performance of the self-seeding fiber laser.

In the self-seeding fiber laser shown in FIG. 8, the data currently to be transmitted is divided into two parts: the first part enters the LDD1, and an ordinary bias current $I_{bias}$ and a modulation current $I_{mod}$ are generated; and the second part passes through a programmable delayer and a phase inverter and then enters an amplifier, and a compensation current $I_{cor}$ is generated. In this way, the normal currents $I_{bias}+I_{mod}$ provided by the LDD1 is applied to the first half part of the gain medium, and the compensation current $I_{cor}$ provided by the LDD2 is applied to the second half part of the gain medium.

The functions of the delayer, the phase inverter, and the amplifier are the same as those in the second example, and the only difference as against the second example is the current loading mode. The following describes the working mode of a two-segment gain medium with examples.

When the injection light returning to the gain medium is "0", if the data to be transmitted at this time is "1", the injection light is amplified by the ordinary bias current and modulation current $I_{bias}+I_{mod}$ at the first half segment of the gain medium; after the light enters the second half segment of the gain medium, because a compensation current $L_c$, is applied at this time, the injection light is amplified again; and, after the injection light is reflected by the back end surface of the gain medium and enters the first half segment of the gain medium again, the injection light is amplified by the ordinary bias current and modulation current $I_{bias}+I_{mod}$ again because the transmitting of the data "1" has generally not been completed by this time. Therefore, the injection light undergoes an amplification-amplification-amplification process.

When the injection light returning to the gain medium is "0", if the data to be transmitted at this time is "0", the injection light is attenuated by the ordinary bias current and modulation current $I_{bias}+I_{mod}$ at the first half segment of the gain medium; after the light enters the second half segment of the gain medium, because a compensation current $I_{cor}$ is applied at this time, the injection light is amplified; and, after the injection light is reflected by the back end surface of the gain medium and enters the first half segment of the gain medium again, the injection light is attenuated again because the transmitting of the data "0" has generally not been completed by this time. Therefore, the injection light undergoes an attenuation-amplification-attenuation process.

When the injection light returning to the gain medium is "1", if the data to be transmitted at this time is "1", the injection light is amplified by the ordinary bias current and modulation current $I_{bias}+I_{mod}$ at the first half segment of the gain medium; after the light enters the second half segment of the gain medium, because no compensation current $I_{cor}$ is applied at this time, the injection light is attenuated; and, after the injection light is reflected by the back end surface of the gain medium and enters the first half segment of the gain medium again, the injection light is amplified by the ordinary bias and modulation current again. Therefore, the injection light undergoes an amplification-attenuation-amplification process.

When the injection light returning to the gain medium is "1", if the data to be transmitted at this time is "0", the injection light is attenuated by the ordinary bias current and modulation current $I_{bias}+I_{mod}$ at the first half segment of the gain medium; after the light enters the second half segment of the gain medium, because no compensation current $I_{cor}$ is applied at this time, the injection light is attenuated again; and, after the injection light is reflected by the back end surface of the gain medium and enters the first half segment of the gain medium again, the injection light is attenuated again. Therefore, the injection light undergoes an attenuation-attenuation-attenuation process.

According to the above analysis, Table 4 summarizes whether a compensation current exists under different conditions and shows amplification and attenuation of the injection light in the gain medium in a round trip. As can be seen from Table 4, if the data currently to be transmitted is "1", the injection light "0" is amplified three times, while the injection light "1" is amplified twice and attenuated once. Therefore, when the injection light is "0", the gain medium undergoes more amplifications so that the transmit power is basically similar to the transmit power existing when the injection light is "1", thereby improving the transmitting performance of the self-seeding fiber laser.

TABLE 4

Amplification and attenuation of compensation current
and injection light under different conditions

| Currently transmitted data | Injection light data returning to the gain medium | |
|---|---|---|
| | 1 | 0 |
| 0 | No compensation (attenuation-attenuation-attenuation) | Compensation (attenuation-amplification-attenuation) |
| 1 | No compensation (amplification-attenuation-amplification) | Compensation (amplification-amplification-amplification) |

Here, a person skilled in the art may understand that the description about the structure and the working process of the compensation apparatus of the self-seeding fiber laser in FIG. 6 may be applicable to the self-seeding fiber laser in this embodiment, to which the embodiment of the present invention does not intend to impose any limitation.

Based on the self-seeding fiber laser and its light return time measurement process and optical power compensation process, this application further provides a method for driving a self-seeding fiber laser. The method for driving a self-seeding fiber laser in the present application can drive the self-seeding fiber laser to implement the self-injection locking, light return time measurement and optical power compensation processes, and compensate for the gain medium driver current of the self-seeding fiber laser according to the power of the injection light, thereby compensating for impacts possibly caused by the power difference between the "1" and the "0" of the injection light on the transmitting power of the self-seeding fiber laser, effectively reducing signal quality deterioration that possibly occurs because the injection light is not a straight light, and improving the transmitting performance of the self-seeding fiber laser.

Specifically, referring to FIG. 10, the method for driving the self-seeding fiber laser in this application may include the following steps:

Step S1: The gain medium emits data light and receives the injection light formed when the data light is partially reflected and returns to the gain medium, where, after the data light undergoes wavelength selection of a corresponding wavelength path in the arrayed waveguide grating, a part of the data light is reflected by the Faraday rotator mirror to form injection light returning to the gain medium.

Step S2: Provide a compensation current for the gain medium selectively according to power of the injection light.

For example, in an embodiment, the providing a compensation current for the gain medium selectively according to power of the injection light may include: when the injection light corresponds to data "0" and data currently to be transmitted is "1", generating a compensation current and outputting it to the gain medium; and, when the injection light corresponds to data "0" and the data currently to be transmitted is "0" or when the injection light corresponds to data "1", providing no compensation current for the gain medium.

In a specific embodiment, the generating a compensation current and outputting it to the gain medium when the injection light corresponds to data "0" and data currently to be transmitted is "1" may include:

delaying, according to light return time of the self-seeding fiber laser, the data currently to be transmitted, where the delayed data is the same as data corresponding to the injection light that is about to return to the gain medium; performing phase inversion for the delayed data; and generating a compensation current selectively according to the data that has undergone the phase inversion and the data currently to be transmitted, and providing the compensation current for the gain medium, where the compensation current is generated and output to the gain medium when the data that has undergone the phase inversion is "1" and the data currently to be transmitted is "1", for example, performing a logical "AND" operation for the data currently to be transmitted and the data output by the phase inverter after the phase inversion; and generating a compensation current and outputting the compensation current to the gain medium when a result of the logical "AND" operation is "1".

In a specific embodiment, the compensation current is generated according to a power difference between the data "0" and the data "1" of the injection light.

Further, the driving method may further include:

generating a modulation current and a bias current according to the data currently to be transmitted, and outputting the modulation current and the bias current to the gain medium, where the data currently to be transmitted is delayed for a preset time and then provided for the laser diode driver to generate the modulation current and the bias current, where the preset time is used to compensate for a delay of the logical "AND" operation process.

In another embodiment, the providing a compensation current for the gain medium selectively according to power of the injection light may include: when the injection light corresponds to data "0", generating a compensation current and outputting it to the gain medium; and, when the injection light corresponds to data "1", providing no compensation current for the gain medium.

The generating a compensation current and outputting it to the gain medium when the injection light corresponds to the data "0" may include: delaying, according to light return time of the self-seeding fiber laser, the data currently to be transmitted, where the delayed data is the same as data corresponding to the injection light that is about to return to the gain medium; performing phase inversion for the delayed data; and amplifying the data output by the phase inverter, where, when the phase inverter outputs data "1", the data "1" is amplified by the amplifier and then provided as a compensation current for the gain medium.

Further, in the foregoing embodiment, the gain medium may include a first gain region close to a light emitting surface and a second gain region far away from the light emitting surface, the modulation current and the bias current that correspond to the data currently to be transmitted are applied to the first gain region, and the compensation current corresponding to current injection light is applied to the second gain region.

In another aspect, the light return time of the self-seeding fiber laser may be calculated by the following method: monitoring injection light returning to the gain medium, performing periodic sampling for a voltage signal corresponding to the injection light, and calculating light return time of the self-seeding fiber laser according to cycle information of a periodically sampled voltage value.

For example, after the gain medium starts to transmit a test signal, a monitor photodiode is used to detect optical power of the injection light returning to the gain medium and convert the optical power into current; the current output by the monitor photodiode is converted into a voltage signal proportionally; periodic sampling is performed for output voltage of the voltage converter; and the light return time of the self-seeding fiber laser is calculated according to the cycle information of the periodically sampled voltage value of the sampling module.

In a specific embodiment, a test signal transmitting process of the gain medium stops before the injection light returns to the gain medium.

Further, the calculating the light return time of the self-seeding fiber laser according to the cycle information of the periodically sampled voltage value of the sampling module may include: calculating the light return time according to corresponding cycle information from a start of the gain medium's transmitting the test signal to a first sampled voltage value after a sampling blank period, where the sampling blank period is a period in which the monitor photodiode can detect only a direct current quantity after the gain medium stops transmitting test data.

Understandably, for details of each step (including optical power compensation and light return time measurement) of the method for driving the self-seeding fiber laser, reference may be made to the description about the structure and the working process of the self-seeding fiber laser, and no repeated description is given here any further.

A person of ordinary skill in the art may appreciate that, in combination with the examples described in the embodiments disclosed in this specification, units and algorithm steps may be implemented by electronic hardware, computer software, or a combination thereof. In order to clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to the corresponding process in the foregoing method embodiments, and the details will not be described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units may be integrated into one unit. The integrated unit may be implemented in a form of hardware, or may be implemented in a form of a software functional unit.

When the integrated unit are implemented in a form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in a form of a software product. The computer software product is stored in a storage medium, and includes several instructions for instructing a computer device (which may be a personal computer, a server, or a network device or the like) to perform all or a part of the steps of the methods described in the embodiments of the present invention. The foregoing storage medium includes: any medium that can store program codes, such as a USB flash disk, a removable hard disk, a read-only memory (Read-Only Memory, ROM), a random access memory (Random Access Memory, RAM), a magnetic disk, or an optical disk.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A self-seeding fiber laser, comprising:
   an arrayed waveguide grating;
   a gain medium, coupled to one branch port of the arrayed waveguide grating;
   a Faraday rotator mirror, coupled to a common port of the arrayed waveguide grating, and configured to reflect a part of optical signals transmitted by the gain medium and form injection light returning to the gain medium, wherein the gain medium, the arrayed waveguide grating, and the Faraday rotator mirror form a laser resonator, and the arrayed waveguide grating is configured to perform wavelength selection in the laser resonator so that a transmitting wavelength of the gain medium is locked into a wavelength path corresponding to the branch port; and
   a compensation apparatus, coupled to the gain medium and configured to provide a compensation current for the gain medium selectively according to power of the injection light.

2. The self-seeding fiber laser according to claim 1, wherein, when the injection light corresponds to data "0" and data currently to be transmitted is "1", the compensation apparatus generates a compensation current and outputs it to the gain medium; and, when the injection light corresponds to data "0" and the data currently to be transmitted is "0" or when the injection light corresponds to data "1", the compensation apparatus does not provide a compensation current for the gain medium.

3. The self-seeding fiber laser according to claim 2, wherein the compensation apparatus comprises a first delay circuit and a compensation current generating circuit, wherein
   the first delay circuit is configured to delay, according to light return time of the self-seeding fiber laser, the data currently to be transmitted, wherein the delayed data output to the compensation current generating circuit is the same as data corresponding to the injection light that is about to return to the gain medium; and
   the compensation current generating circuit is connected to the first delay circuit, and is configured to generate a compensation current selectively according to output data of the first delay circuit and the data currently to be transmitted, and provide the compensation current for the gain medium.

4. The self-seeding fiber laser according to claim 3, wherein the compensation apparatus further comprises a controller, configured to control a delay time of the first delay circuit according to the light return time, and control, according to a power difference between the data "0" and the data "1" of the injection light, the compensation current generating circuit to generate a compensation current of a corresponding current value.

5. The self-seeding fiber laser according to claim 3, wherein the compensation apparatus further comprises a phase inverter, connected between the first delay circuit and the compensation current generating circuit, and configured to perform phase inversion for the output data of the first delay circuit, and provide the data for the compensation current generating circuit.

6. The self-seeding fiber laser according to claim 5, wherein the compensation current generating circuit comprises a logical AND gate and a first laser diode driver, wherein
the logical AND gate, with one input end connected to the phase inverter, and an other input end receiving the data currently to be transmitted, is configured to perform a logical "AND" operation for the data currently to be transmitted and the data output by the phase inverter after the phase inversion, and output an operation result to the laser diode driver; and
the first laser diode driver is configured to generate a compensation current selectively as indicated by the operation result, and output the compensation current to the gain medium.

7. The self-seeding fiber laser according to claim 6, further comprising a second delay circuit and a second laser diode driver, wherein
the second laser diode driver is configured to generate a modulation current and a bias current according to the data currently to be transmitted, and output the modulation current and the bias current to the gain medium; and
the second delay circuit is configured to delay, for a preset time, the data currently to be transmitted and provide the data for the second laser diode driver, wherein the preset time is used to compensate for a delay of a logical "AND" operation process of the AND gate, so that the bias current and the modulation current that correspond to the data currently to be transmitted and provided by the second laser diode driver are output to the gain medium in parallel with the compensation current provided by the first laser diode driver.

8. The self-seeding fiber laser according to claim 1, wherein, when the injection light corresponds to data "0", the compensation apparatus generates a compensation current and outputs it to the gain medium; and, when the injection light corresponds to data "1", the compensation apparatus does not provide the compensation current for the gain medium.

9. The self-seeding fiber laser according to claim 8, wherein the compensation apparatus comprises a delay circuit, a phase inverter, and an amplifier, wherein
the delay circuit is configured to delay, according to light return time of the self-seeding fiber laser, the data currently to be transmitted, wherein the delayed data output to the compensation current generating circuit is the same as data corresponding to the injection light that is about to return to the gain medium;

the phase inverter is connected to the delay circuit, and is configured to perform phase inversion for output data of the delay circuit; and
the amplifier is connected to the phase inverter, and is configured to amplify the data output by the phase inverter, wherein, if the phase inverter inputs data "1", the data "1" is amplified by the amplifier and then provided as a compensation current for the gain medium.

10. The self-seeding fiber laser according to claim 1, wherein the gain medium comprises a first gain region close to a light emitting side and a second gain region far away from the light emitting side, the modulation current and the bias current that correspond to the data currently to be transmitted are applied to the first gain region, and the compensation current corresponding to current injection light is applied to the second gain region.

11. The self-seeding fiber laser according to claim 1, further comprising:
a light return time measurement apparatus, configured to monitor injection light returning to the gain medium, perform periodic sampling for a voltage signal corresponding to the injection light, and calculate light return time of the self-seeding fiber laser according to cycle information of a periodically sampled voltage value.

12. The self-seeding fiber laser according to claim 11, wherein the light return time measurement apparatus comprises:
a monitor photodiode, connected to the gain medium and configured to detect, after the gain medium starts to transmit a test signal, optical power of the injection light returning to the gain medium, and convert the optical power into current;
a voltage converter, connected to the monitor photodiode, and configured to convert the current output by the monitor photodiode into a voltage signal proportionally;
a sampling module, connected to the voltage converter, and configured to perform periodically sampling for output voltage of the voltage converter; and
a controller, configured to calculate the light return time of the self-seeding fiber laser according to the cycle information of the periodically sampled voltage value of the sampling module.

13. The self-seeding fiber laser according to claim 12, wherein the controller is further configured to control a test signal transmitting process of the gain medium to stop before the injection light returns to the gain medium.

14. The self-seeding fiber laser according to claim 13, wherein the controller calculates the light return time according to corresponding cycle information from a start of the gain medium's transmitting the test signal to a first sampled voltage value after a sampling blank period, wherein the sampling blank period is a period in which the monitor photodiode can detect only a direct current quantity after the gain medium stops transmitting test data.

15. A method for driving a self-seeding fiber laser, wherein the self-seeding fiber laser comprises a laser resonator formed by a gain medium, an arrayed waveguide grating, and a Faraday rotator mirror, and the method comprises:
emitting, by the gain medium, data light, wherein, after the data light undergoes wavelength selection of a corresponding wavelength path in the arrayed waveguide grating, a part of the data light is reflected by the Faraday rotator mirror to form injection light returning to the gain medium; and
providing a compensation current for the gain medium selectively according to power of the injection light.

16. The method according to claim 15, wherein the providing a compensation current for the gain medium selectively according to power of the injection light comprises:
    generating a compensation current and outputting the compensation current to the gain medium when the injection light corresponds to data "0" and data currently to be transmitted is "1"; and
    not providing a compensation current for the gain medium when the injection light corresponds to the data "0" and the data currently to be transmitted is "0" or when the injection light corresponds to the data "1".

17. The method according to claim 16, wherein the providing a compensation current for the gain medium selectively according to power of the injection light comprises:
    delaying, according to light return time of the self-seeding fiber laser, the data currently to be transmitted, wherein the delayed data is the same as data corresponding to the injection light that is about to return to the gain medium;
    performing phase inversion for the delayed data; and
    generating a compensation current selectively according to the data that has undergone the phase inversion and the data currently to be transmitted, and providing the compensation current for the gain medium, wherein the compensation current is generated and output to the gain medium when the data that has undergone the phase inversion is "1" and the data currently to be transmitted is "1".

18. The method according to claim 17, wherein the compensation current is generated according to a power difference between the data "0" and the data "1" of the injection light.

19. The method according to claim 17, wherein the generating a compensation current selectively according to the data that has undergone the phase inversion and the data currently to be transmitted, and providing the compensation current for the gain medium, comprises:
    performing a logical "AND" operation for the data currently to be transmitted and the data output by the phase inverter after the phase inversion; and
    generating a compensation current and outputting the compensation current to the gain medium when a result of the logical "AND" operation is "1".

20. The method according to claim 19, further comprising:
    generating a modulation current and a bias current according to the data currently to be transmitted, and outputting the modulation current and the bias current to the gain medium, wherein the data currently to be transmitted is delayed for a preset time and then provided for a laser diode driver to generate the modulation current and the bias current, wherein the preset time is used to compensate for a delay of the logical "AND" operation process.

21. The method according to claim 15, wherein the providing a compensation current for the gain medium selectively according to power of the injection light comprises:
    generating a compensation current and outputting the compensation current to the gain medium when the injection light corresponds to the data "0"; and
    providing no compensation current for the gain medium when the injection light corresponds to the data "1".

22. The method according to claim 21, wherein the generating a compensation current and outputting the compensation current to the gain medium when the injection light corresponds to the data "0" comprises:
    delaying, according to light return time of the self-seeding fiber laser, the data currently to be transmitted, wherein the delayed data is the same as data corresponding to the injection light that is about to return to the gain medium;
    performing phase inversion for the delayed data; and
    amplifying the data output by the phase inverter, wherein, when the phase inverter outputs data "1", the data "1" is amplified by the amplifier and then provided as a compensation current for the gain medium.

23. The method according to claim 15, wherein the gain medium comprises a first gain region close to a light emitting side and a second gain region far away from the light emitting side, the modulation current and the bias current that correspond to the data currently to be transmitted are applied to the first gain region, and the compensation current corresponding to current injection light is applied to the second gain region.

24. The method according to claim 15, further comprising:
    monitoring injection light returning to the gain medium, performing periodic sampling for a voltage signal corresponding to the injection light, and calculating light return time of the self-seeding fiber laser according to cycle information of a periodically sampled voltage value.

25. The method according to claim 24, wherein the monitoring injection light returning to the gain medium, performing periodic sampling for a voltage signal corresponding to the injection light, and calculating light return time of the self-seeding fiber laser according to cycle information of a periodically sampled voltage value, comprises:
    after the gain medium starts to transmit a test signal, using a monitor photodiode to detect optical power of the injection light returning to the gain medium and convert the optical power into current;
    converting the current output by the monitor photodiode into a voltage signal proportionally;
    performing periodic sampling for output voltage of the voltage converter; and
    calculating the light return time of the self-seeding fiber laser according to the cycle information of the periodically sampled voltage value of the sampling module.

26. The method according to claim 25, wherein a test signal transmitting process of the gain medium stops before the injection light returns to the gain medium.

27. The method according to claim 26, wherein the calculating the light return time of the self-seeding fiber laser according to the cycle information of the periodically sampled voltage value of the sampling module comprises:
    calculating the light return time according to corresponding cycle information from a start of the gain medium's transmitting the test signal to a first sampled voltage value after a sampling blank period, wherein
    the sampling blank period is a period in which the monitor photodiode can detect only a direct current quantity after the gain medium stops transmitting test data.

28. A passive optical network system, comprising: an optical line terminal, multiple optical network units, and a remote node between the optical line terminal and the optical network units, wherein
    the remote node comprises an arrayed waveguide grating and a Faraday rotator mirror, wherein the arrayed waveguide grating comprises a common port and multiple branch ports, the common port is connected to the optical line terminal through a backbone fiber, the Faraday rotator mirror is coupled to the backbone fiber, and the branch ports are connected to the optical network units through branch fibers; and
    the optical network unit comprises a light emitter with a gain medium, wherein the gain medium, the arrayed waveguide grating, and the Faraday rotator mirror form a self-seeding fiber laser according to claim 1.

29. An optical line terminal, comprising: an arrayed waveguide grating, a Faraday rotator mirror, and multiple light emitters with a gain medium, wherein the multiple optical light emitters are connected to a backbone fiber through the arrayed waveguide grating, and the Faraday rotator mirror is coupled to the backbone fiber; and
 the gain medium of the light emitters, the arrayed waveguide grating, and the Faraday rotator mirror form a self-seeding fiber laser according to claim 1.

* * * * *